US006559508B1

(12) United States Patent
Lin et al.

(10) Patent No.: US 6,559,508 B1
(45) Date of Patent: May 6, 2003

(54) ESD PROTECTION DEVICE FOR OPEN DRAIN I/O PAD IN INTEGRATED CIRCUITS WITH MERGED LAYOUT STRUCTURE

(75) Inventors: Geeng-Lih Lin, Hsinchu (TW); Ming-Dou Ker, Hsinchu (TW)

(73) Assignee: Vanguard International Semiconductor Corporation, Hsin-Chu (TW)

(*) Notice: Subject to any disclaimer, the term of this patent is extended or adjusted under 35 U.S.C. 154(b) by 0 days.

(21) Appl. No.: 09/664,419

(22) Filed: Sep. 18, 2000

(51) Int. Cl.[7] .............................................. H01L 23/62
(52) U.S. Cl. ....................................... 257/360; 257/355
(58) Field of Search ................................ 257/361, 362, 257/365, 367, 370, 335, 357, 360, 358, 359, 347, 371, 301, 304, 288, 296, 622

(56) References Cited

U.S. PATENT DOCUMENTS

| | | | |
|---|---|---|---|
| 5,237,395 A | | 8/1993 | Lee ............................. 257/358 |
| 5,365,103 A | * | 11/1994 | Brown et al. ................ 257/497 |
| 5,532,178 A | | 7/1996 | Liaw et al. ................... 437/57 |
| 5,689,133 A | | 11/1997 | Li et al. ...................... 257/361 |
| 5,847,429 A | * | 12/1998 | Lien et al. ................... 257/355 |
| 6,037,636 A | * | 3/2000 | Crippen ...................... 257/355 |
| 6,097,066 A | * | 8/2000 | Lee et al. .................... 257/355 |
| 6,201,277 B1 | * | 3/2001 | Esquivel ..................... 257/316 |
| 6,317,306 B1 | * | 11/2001 | Chen et al. ................... 361/56 |

FOREIGN PATENT DOCUMENTS

| | | | |
|---|---|---|---|
| JP | 405121669 A | * | 5/1993 |
| JP | 406232393 A | * | 8/1994 |

* cited by examiner

Primary Examiner—Wael Fahmy
Assistant Examiner—Dana Farahani
(74) Attorney, Agent, or Firm—George O. Saile; Stephen B. Ackerman; William Robertson

(57) ABSTRACT

An open drain driver circuit and a Vss to Vdd FET with a merged layout structure are formed to provide a short path for an ESD current from an associated pad and either Vss or Vdd. The short path reduces the IR drop in the path and thereby maintains a lower voltage at the pad during an ESD event. The driver and the Vss to Vdd FET are each formed of one or more cells that each comprise two source diffusions, two gates, and a common drain diffusion. A frame of the opposite conductivity type as the drain and source diffusions surrounds the components of each cell. The driver and Vss to Vdd FET cells are formed closely adjacent and share common parts of the frame. Several configurations with merged layout structures are disclosed that provide a short ESD current path.

18 Claims, 8 Drawing Sheets

ESD PROTECTION DEVICE FOR OPEN DRAIN I/O PAD IN INTEGRATED CIRCUITS WITH MERGED LAYOUT STRUCTURE

RELATED APPLICATIONS

An application for "ESD Protection for Open drain I/O Pad in Integrated Circuits with Parasitic Field FET Device", Ser. No. 09/664,420, assigned to the assignee of this invention, has a related disclosure.

FIELD OF THE INVENTION

This invention relates generally to semiconductor integrated circuit devices and more specifically to a circuit device with improved protection against electrostatic discharge (ESD) stress at the input-output pad of the device.

INTRODUCTION

ESD voltages are a familiar problem for developers of semiconductor chips for integrated circuit devices. An ESD voltage appears at an input-output pad of the chip when, for example, a voltage is picked up by a conductor that runs between the pad and a circuit node external to the device. A pad is a small conductive area on a chip that forms a circuit node where external conductors can be attached to the chip. On the chip, a pad is usually connected to the input of an input buffer circuit or to the output of a driver circuit or to both. The driver itself can provide protection against some ESD events, as will be discussed later.

One familiar driver circuit is an inverter formed by two FETs. An upper FET is connected to conduct between the output pad and Vdd and a lower FET is connected to conduct between the output pad and Vss. (Vss and Vdd are the usual designations for the power supply terminals of the device.) In one binary state of an input signal, the gates of the FETs receive voltages that turn off the lower FET and turn on the upper FET to pull the output pad up. In the other binary input state, the signals at the gates of the FETs turn off the upper FET and turn on the lower FET to pull the output pad down.

An ESD protection device clamps the ESD voltage to a value that will not damage circuits on the chip that are connected to the pad. An ESD protection device creates a low resistance current path that clamps the voltage at the pad to a safe value. Sometimes a resistor is connected in one or more of the branches between the pad and the protected circuits to further isolate the pad voltage from the protected circuits.

An ESD current path can be established when a semiconductor junction breaks down in response to a high ESD voltage. This junction breakdown occurs because the voltage on the ESD side of the junction has reached a break down value with respect to the voltage on the other side of the junction. The voltage on the other side of the junction is commonly established by the power supply nodes, Vss and Vdd, and the ESD current path ordinarily includes Vss or Vdd. The ESD current can also flow in a path between Vss and Vdd.

The driver circuit that has just been described can be used for ESD protection. When a high positive voltage appears at the pad with respect to the grounded Vss, the drain to substrate junction of the lower FET is reverse biased and it breaks down at a predetermined voltage. Thus, in response to a high positive voltage, the lower FET conducts to Vss and clamps the pad voltage to a value that does not damage other circuits connected to the pad. Similarly, when a high negative voltage appears at the pad with respect to the grounded Vss, the lower FET conducts to Vss and limits the pad voltage. Commonly, the drain is made larger to handle the ESD current. The larger drain increases the capacitance at the pad and in this way slows the rise and fall of pulses at the pad.

Sometimes an open drain driver is used with an input-output pad. This driver circuit is like the circuit just described except that it does not have the upper FET: the output is pulled down in the way described but it is pulled up by the external circuits that are connected to the pad, and these circuits do not provide a low resistance path for an ESD current from the pad to Vdd.

The high ESD voltage at a pad can be referenced to either Vss or Vdd, and the pad must be protected against both forms of the ESD voltage. It will be helpful to consider an example of a circuit that does not meet this object: an open drain driver. As already explained, an open drain driver would maintain a low voltage between the pad and Vss. However, in a circuit with an open drain driver for ESD protection, a high voltage could is develop between the pad and Vdd.

The prior art has suggested connecting FET between Vss and Vdd to turn on and conduct in series with the open drain driver when an ESD voltage appears between the Pad and Vdd. The Vss to Vdd FET has its source connected to Vss, its drain connected to Vdd, and its gate connected to Vss to keep it turned off in normal operation. When an ESD voltage of either polarity appears between the pad and Vdd, the drain to channel junction or the source to channel junction (depending on the polarity of the ESD voltage) of the Vss to Vdd FET breaks down and conducts in series with the driver to conduct the ESD current between the pad and Vdd.

SUMMARY OF THE INVENTION

One object of this invention is to provide improved ESD protection, particularly for a pad having an open drain driver circuit.

We provide a conductive path between Vss and Vdd that becomes enabled in response to a high voltage that would otherwise develop between these power supply points during some ESD events. The device comprises FET connected between Vss and Vdd. The gate of the FET is connected to ground to keep it turned off during operations when only normal voltages appear at the pad.

The preferred FET is formed as two parallel FETs having a common drain diffusion and individual source diffusions. A frame of the opposite conductivity type as the drain and source surrounds the two FETs. This circuit forms a cell, and a driver is made up of an array of these cells. The array can be made in any convenient size, and in the driver that will be described later the number of rows and columns is dependent on the device dimensions of the FET in the open drain driver.

A cell can also form a Vss to Vdd FET that turns on in response to an ESD voltage between the pad and Vdd. The driver conducts between the pad and Vss and the Vss to Vdd FET conducts between the pad and Vdd, and these two FETs thereby form a circuit between the pad and Vdd. To reduce the occupied silicon area, a merged layout structure is described in this specification.

It will be helpful to visualize the driver and the pad as each having a square or rectangular shape. (The actual shape may be different.) The driver is located with one of its edges closely adjacent to an edge of an associated pad. This location provides a low resistance in the ESD current path, and the low resistance reduces the voltage drop that would otherwise be produced by the flow of the ESD current at the pad.

The Vss to Vdd FET can be formed in several configurations. When it is a single cell, it can be located along any of the edges of the driver that do not abut the pad. This configuration keeps a low resistance between the pad and the Vss to Vdd FET but allows the driver to have the position of lowest possible resistance. When two Vss to Vdd FETs are located along opposite edges of the driver, their resistance is paralleled.

Several configurations are disclosed that provide this advantageous spatial relation between the pad, the driver and the Vss to Vdd FET. In some configurations, the Vss to Vdd FET is formed as an array of cells that are extensions of the rows or columns of the driver. In one configuration, a single Vss to Vdd FET is located between the drivers of two pads and is shared by the two pads with a merged layout structure.

Other features of the invention will appear in the description of my preferred embodiment.

THE DRAWING

THE PREFERRED EMBODIMENT

Figure 1:
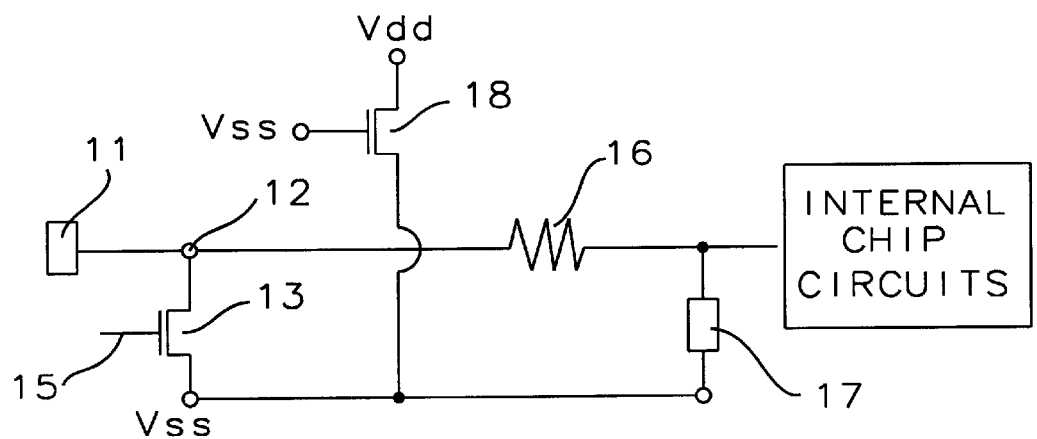
FIG. 1 is a schematic diagram of a pad and an associated driver FET of an integrated circuit FET and the Vss to Vdd FET of this invention.

Introduction—the Driver Circuit of FIG. 1

FIG. 1 shows an input-output pad 11 that is to be protected from ESD voltages that may appear for example on the wires that connect this pad to external circuit nodes.

Pad 11 is connected to the output 12 of an open drain NMOS inverter formed by a driver FET 13. The source of driver FET 13 is connected to potential point Vss and the drain terminal forms driver output 12. The gate terminal 15 of driver FET 13 is connected to receive signals that turn it on and off (The signal sources are conventional and are not shown in the drawing.) Pad 11 may also have an input buffer circuit that is not shown in the drawing.

A resistor 16 is optionally connected in the path between pad 11 and the internal circuits of the chip. The resistor helps to isolate the internal circuits from an ESD voltage at the pad.

An ESD protection device 17 (which is often a gate-grounded short-channel NMOS FET) is optionally connected between pad 11 and Vss. When an ESD voltage appears between the pad and Vss, device 17 turns on and thereby limits the pad voltage to a value that does not damage the internal circuits of the chip. There is an extensive art of devices that provide this function. Device 17 does not provide protection against an ESD voltage that appears between the pad and Vdd.

ESD Stress Across Pad 11 and Vdd—FIG. 1

FET 18 is connected between Vss and Vdd to protect against an ESD voltage that develops between the pad and Vdd. As has already been explained, the reverse biased junction between a drain or source diffusion and the substrate breaks down and conducts when an ESD voltage appears at one of the terminals of FET. (Protection FET 18 can conduct in either direction.) FET 18 can be understood further from a description of the FET structure.

Figure 2:
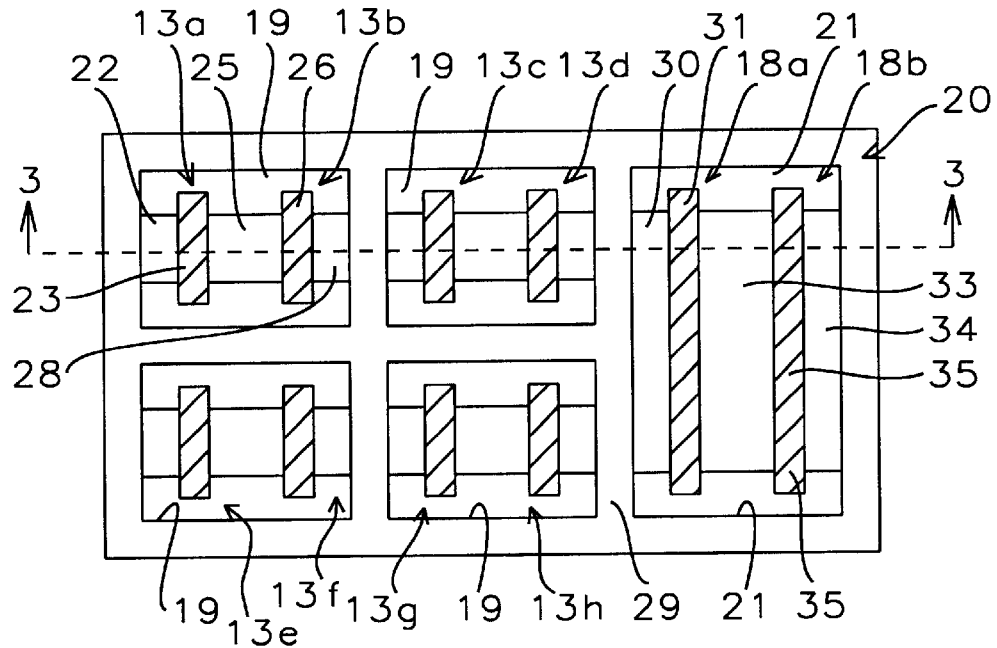
FIG. 2 is a top view of the semiconductor with merged layout structure of the driver FET and the Vss to Vdd FET of FIG. 1.
Figure 3:
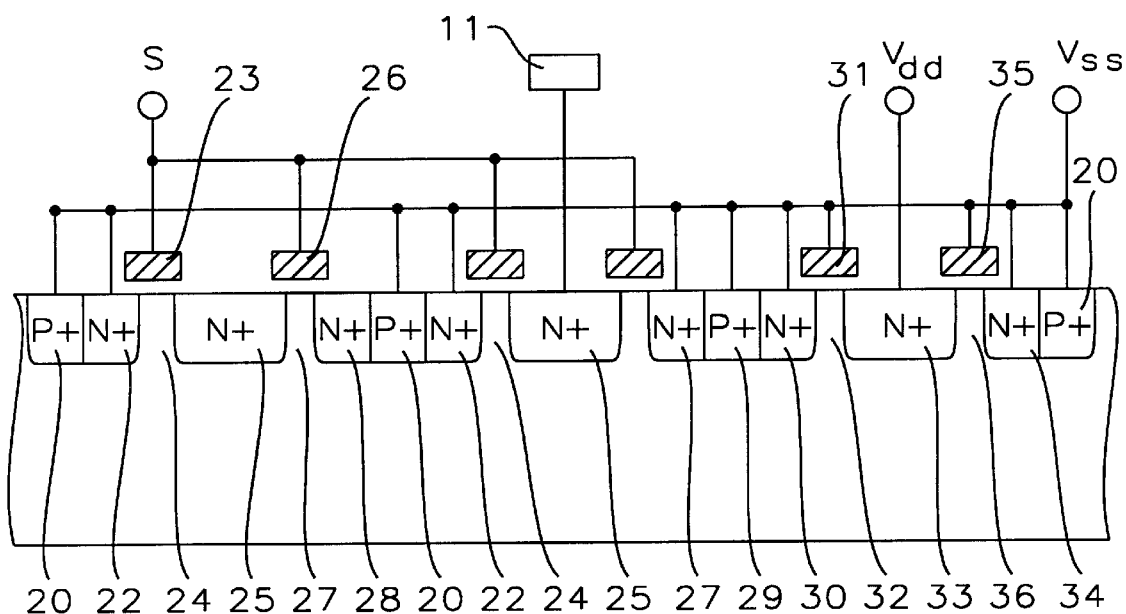
FIG. 3 is an edge view of the semiconductor with merged layout structure along line 3—3 of FIG. 2.

The FET Structure of FIGS. 2 and 3—Introduction

In the structure of FIGS. 2 and 3, driver FET 13 is embodied as four pairs of parallel FETs. Each of these FET pairs is formed within an inner edge 19 of a frame 20 (described later). Vss to Vdd FET 18 is embodied as one pair of parallel FETs formed within a different inner edge 21 of the frame. The individual FETs are identified by the reference character 13 or 18 with a lower case letter suffix. For example, FETs 13a and 13b are formed as a pair within a common sub-frame of frame 20.

The Driver FET 13—FIGS. 2 and 3

FETs 13a and 13b are representative of a parallel FET pair. FET 13a has a source diffusion 22, a gate 23 and an underlying channel 24, and a diffusion 25 that forms the drain of both FETs 13a and 13b. FET 13b is a mirror image of FET 13a and shares drain diffusion 25 and has a gate 26 and an underlying channel 27 and a source diffusion 28.

The Vss to Vdd FET 18—FIG. 2

Vss to Vdd FET 18 is similar in structure to driver FET 13. It has a first source diffusion 30, a gate 31 and underlying channel 32, and a common drain diffusion 33, a second source diffusion 34, gate 35 and underlying channel 36.

The Frame 20

Frame 20 forms part of the ESD protection system, as will be explained later. The frame is formed of a conductivity type (p-type) that is opposite to the conductivity type of the drain and source diffusions (n-type) to isolate the components inside the frame, as is well known.

Frame 20 forms sub-frames around each of the four pairs of FETs that make up FET 13 and around the single pair of FETs that make up FET 18. The sub-frames for FET pair 13c and 13d, FET paid 13g and 13h, and FET pair 18a and 18b share a part 29 of frame 20.

Figure 4:
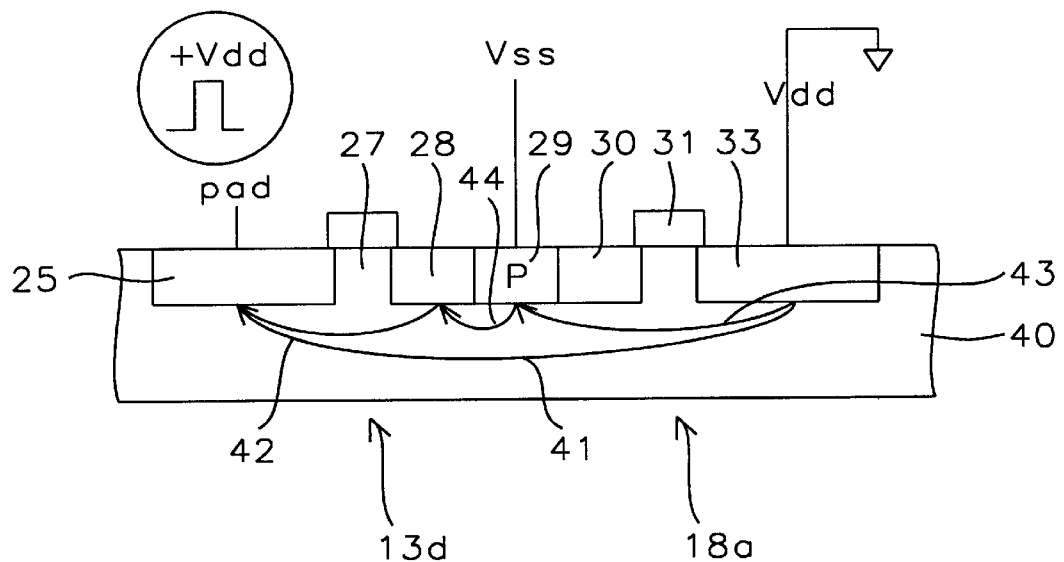
FIGS. 4 and 5 are simplified edge views similar to FIG. 3 and show the ESD current paths for positive and negative ESD events.
Figure 5:
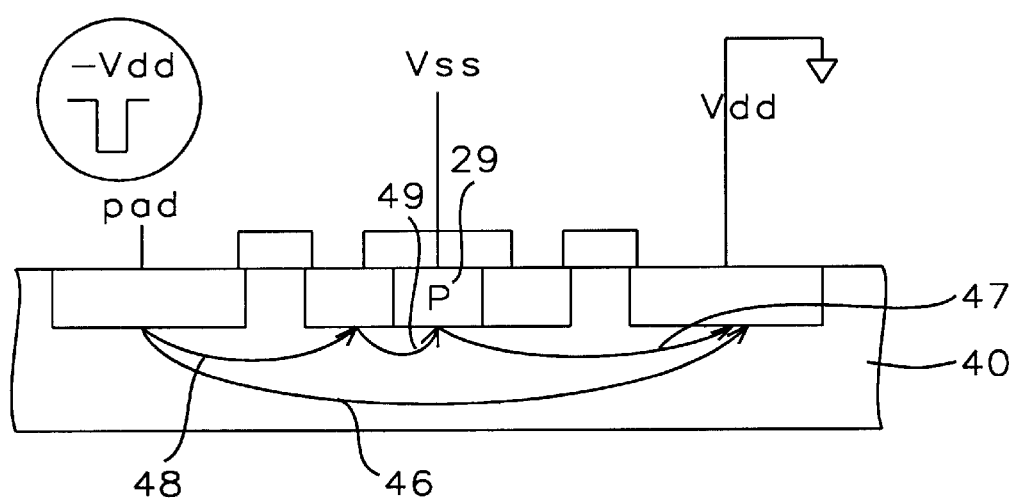

Operation—Introduction to FIGS. 4 and 5

In this description, the term +Vdd means that the ESD event appears as a positive voltage at the pad with respect to Vdd grounded and that the ESD protection device forms a path to Vdd for the ESD current. Similarly, the term −Vdd means that the ESD voltage at the pad is negative with respect to Vdd grounded. The term +/−Vdd is a generalization of +Vdd and −Vdd.

Four lines in each of these Figs. show the ESD current paths through the substrate 40 for FETs 13 and 18 of FIG. 1. These lines have arrows that point in the current flow direction.

The edge view of FIGS. 4 and 5 will be easily related to the more detailed views of FIGS. 2 and 3, and the reference characters specifically show the shared frame part 29 and the two adjoining FETs 13d and 18a. (FET 13h also adjoins FET 18a and cooperates with FET 18a in the way that will be described for FET 13d.)

From left to right in FIGS. 4 and 5, the components of FET 13 are the common drain diffusion 25; the channel 24 and gate 23, and the source diffusion 22. The P-type shared frame part 29 separates FETs 13 and 18. The components of FET 18 from left to right are the source 30, the gate 34 and channel 32, and the common drain diffusion 33. These components are significant in this description because they form circuit nodes and semiconductor junctions in the ESD current paths.

Operation for +Vdd—FIG. 4

FIG. 4 represents the +Vdd condition, a positive ESD voltage between the pad and Vdd. The circuit forms an ESD current path between the pad and Vdd.

Line 41 shows a path for ESD current that is established by Vss to Vdd FET 18. The junction of n-type drains 25 and 33 and p-type substrate 40 are normally reverse biased because Vdd is positive with respect to the substrate. A high positive voltage at pad 11 similarly reverse biases the junction of the substrate and the drain 25 of FET 13, but it causes the junction to break down, and charge carriers flow from drain 25 flow into the substrate 40 and through the substrate to drain 33 of FET 18. (The junction of drain 33 and the substrate is forward biased under this ESD stress condition.)

The path 41 through the substrate has a low resistance because the substrate path is wide across the direction of current flow in the merged layout structure.

Line 42 represents a path from drain 25 to source 22, the conventional breakdown of FET 13 which is described in the introduction.

During a +Vdd ESD event, the pad is positive with respect to Vdd, and line 43 represents a path between drain 33 and shared frame part 29. The Vss terminal in this stress condition is a floating node.

Line 44 represents the path of ESD current flowing in the substrate between shared frame part 29 and the source 22 of FET 13.

Operation for −Vdd—FIG. 5

When a negative ESD voltage appears at the pad with respect to Vdd grounded, the circuit of this invention establishes ESD current paths that will be readily understood from the description of the positive ESD event illustrated by FIG. 4.

For example, line 46 is analogous to line 41 in FIG. 4 and shows the path between drains 25 and 33. The paths represented by lines 47 through 49 will be understood from the description of lines 42–44 in FIG. 4.

The Relation of FETs 13 and 18 to the Pad—FIGS. 6A Through 6D

Figure 6A:
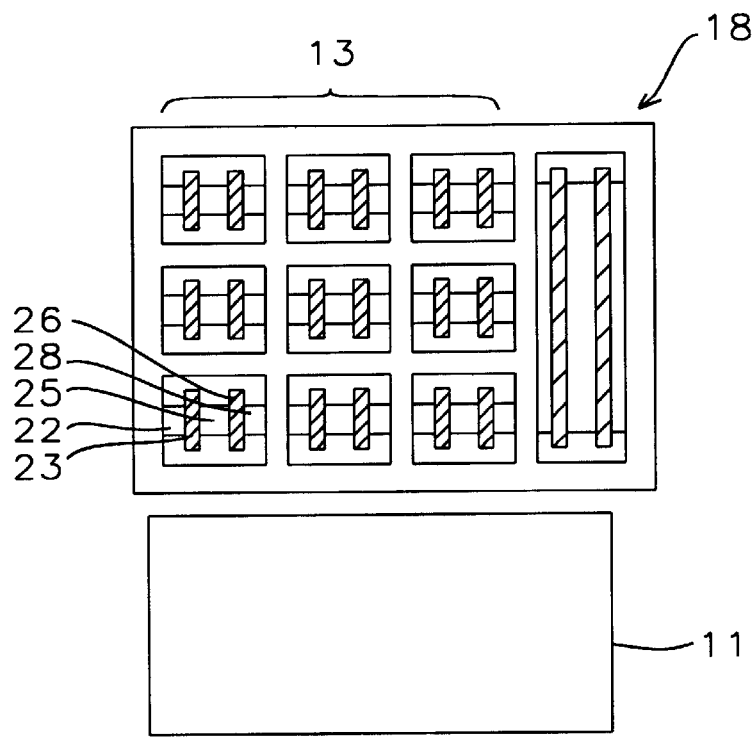
FIGS. 6A through 6D show four configurations of the open drain driver FET, the Vss to Vdd FET and a pad protected by these FETs with a merged layout structure.

In each of these Figs. an open drain driver FET 13 and a Vss to Vdd FET 18 are located closely adjacent to a bonding pad 11 (above the pad in the drawing). The device of FIG. 6A is similar in layout to FIG. 2, and only the differences will be discussed here. The open drain driver FET 13 is formed as a three by three array of cells. A connection (not shown) extends vertically from the pad over each column and contacts the common drain diffusions. A connection from Vss (not shown) extends horizontally across each row and contacts the two source diffusions in each cell. The gates of the open drain driver are similarly connected to a source of a signal for controlling the driver.

The horizontal lines for Vss also extend over the Vss to Vdd FET and connect to its two source diffusions and two gates. A connection (not shown) extends down across the common drain diffusion of FET 18 to connect the drain to Vdd.

Thus, the layout of FIG. 6A provides very short paths for an ESD current at the pad 11 to either Vss or Vdd.

Figure 6B:
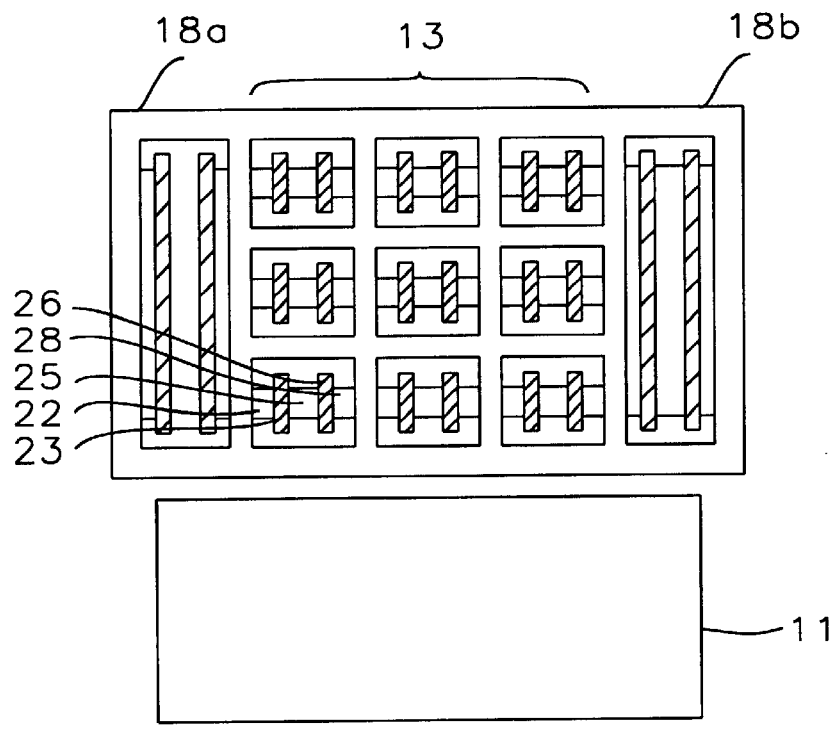

FIG. 6B is similar to FIG. 6A and shows two Vss to Vdd FETs 18 formed as a mirror image of the Vss to Vdd FET in FIG. 6A. The Vdd connections to each Vss to Vdd FET are the same as in FIG. 6A, and a horizontal bus interconnects the two vertical busses for Vdd.

Figure 6C:
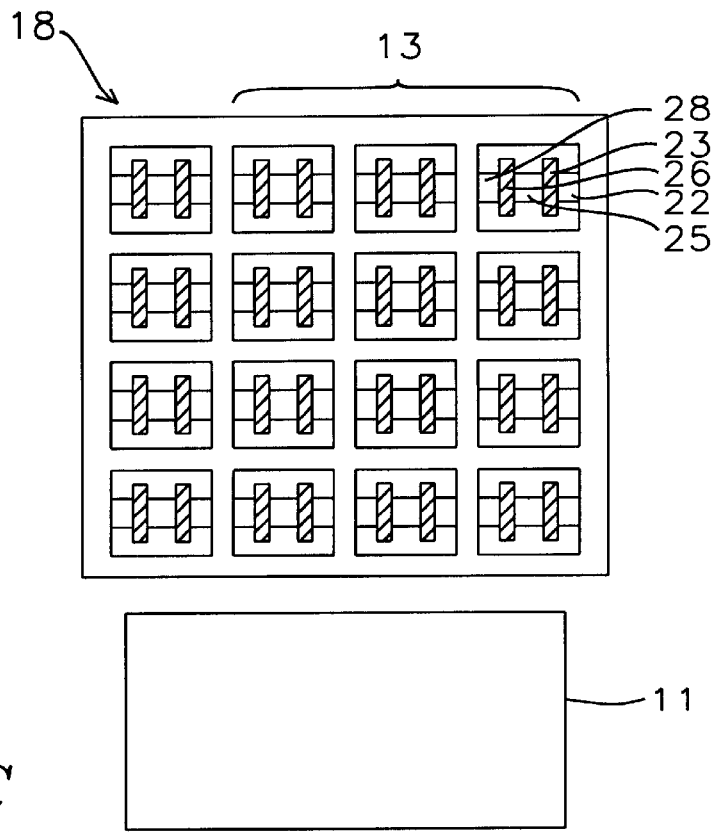

In FIG. 6C, the open drain driver 13 FET is formed as a three by three array of cells in the way that has been described for FIGS. 6A and 6B. The Vss to Vdd FET 18 is also formed as an array of cells. In FIG. 6C, the cells of the Vss to Vdd FET 18 are formed as a column of three cells. The connections to the open drain driver and the Vss to Vdd FET in FIG. 6C are the same as the connections described for FIG. 6A. The driver is located for all of the cells near the pad to border the pad and the Vss to Vdd FET is located for the cell near the pad to partly border the pad. Thus, the resistance between the pad and the driver is a minimum and the resistance between the pad and the Vss to Vdd FET is reduced.

Figure 6D:
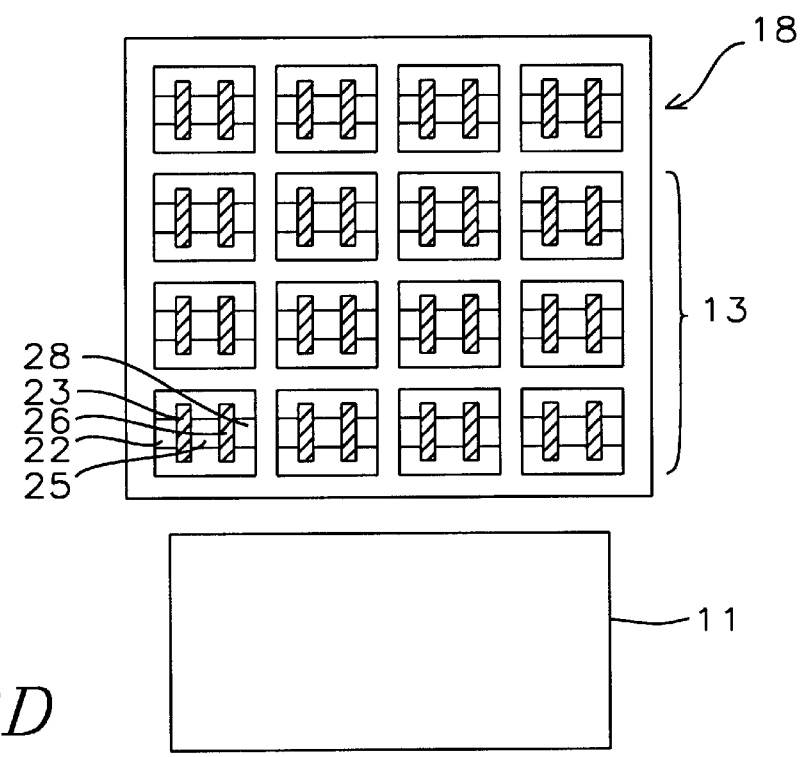

In the four by four array of cells shown in FIG. 6D, the rows nearest the pad 11 form the driver FET 13 and the row farthest from pad 11 forms the Vss to Vdd FET 18. The source connections run horizontally across the rows and connect each source diffusion and the gates of the Vss to Vdd FET to Vss. The connections from the pad run up the columns of the rows that form the driver and connections from the Vdd bus run down each column of the single row that forms the Vss to Vdd FET.

Figure 7A:
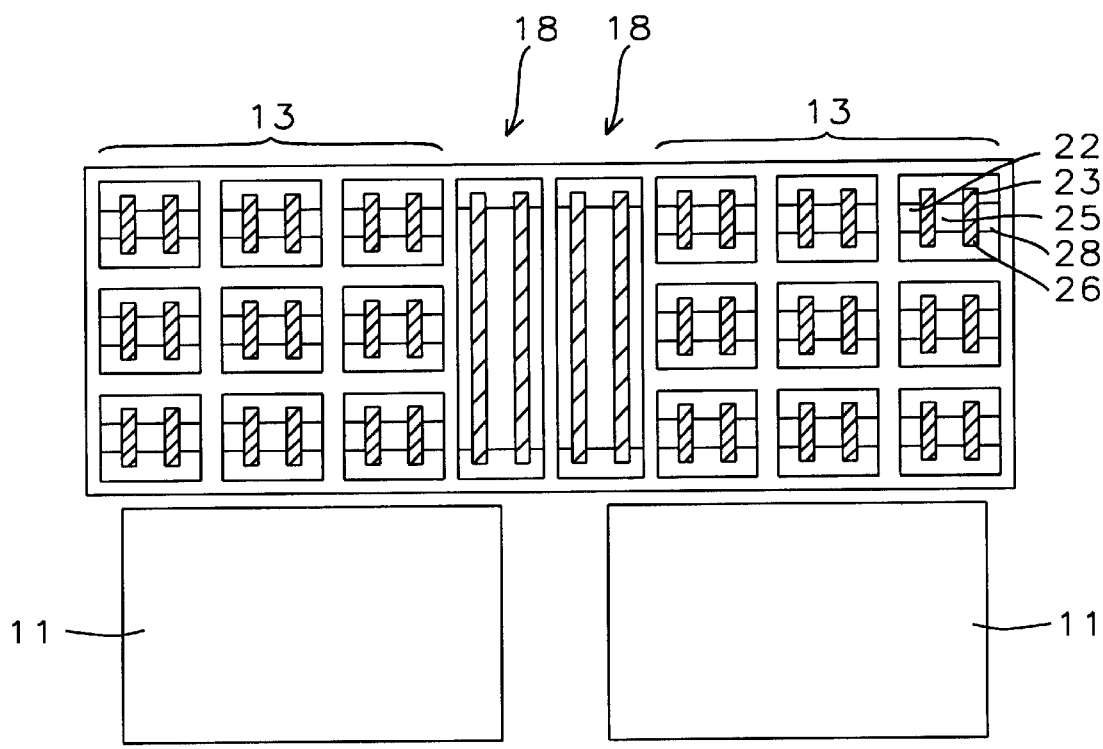
FIGS. 7A through 7C show three other configurations of the open drain driver FET, the Vss to Vdd FET and a pad protected by these FETs with a merged layout structure.
Figure 7B:
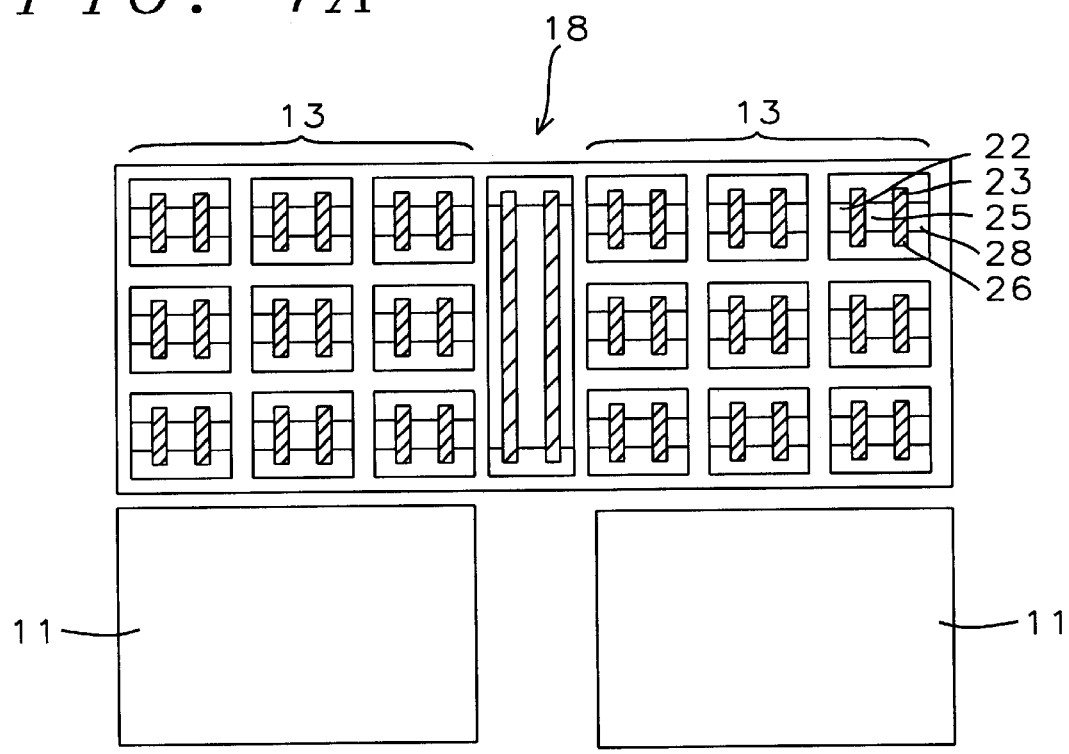
Figure 7C:
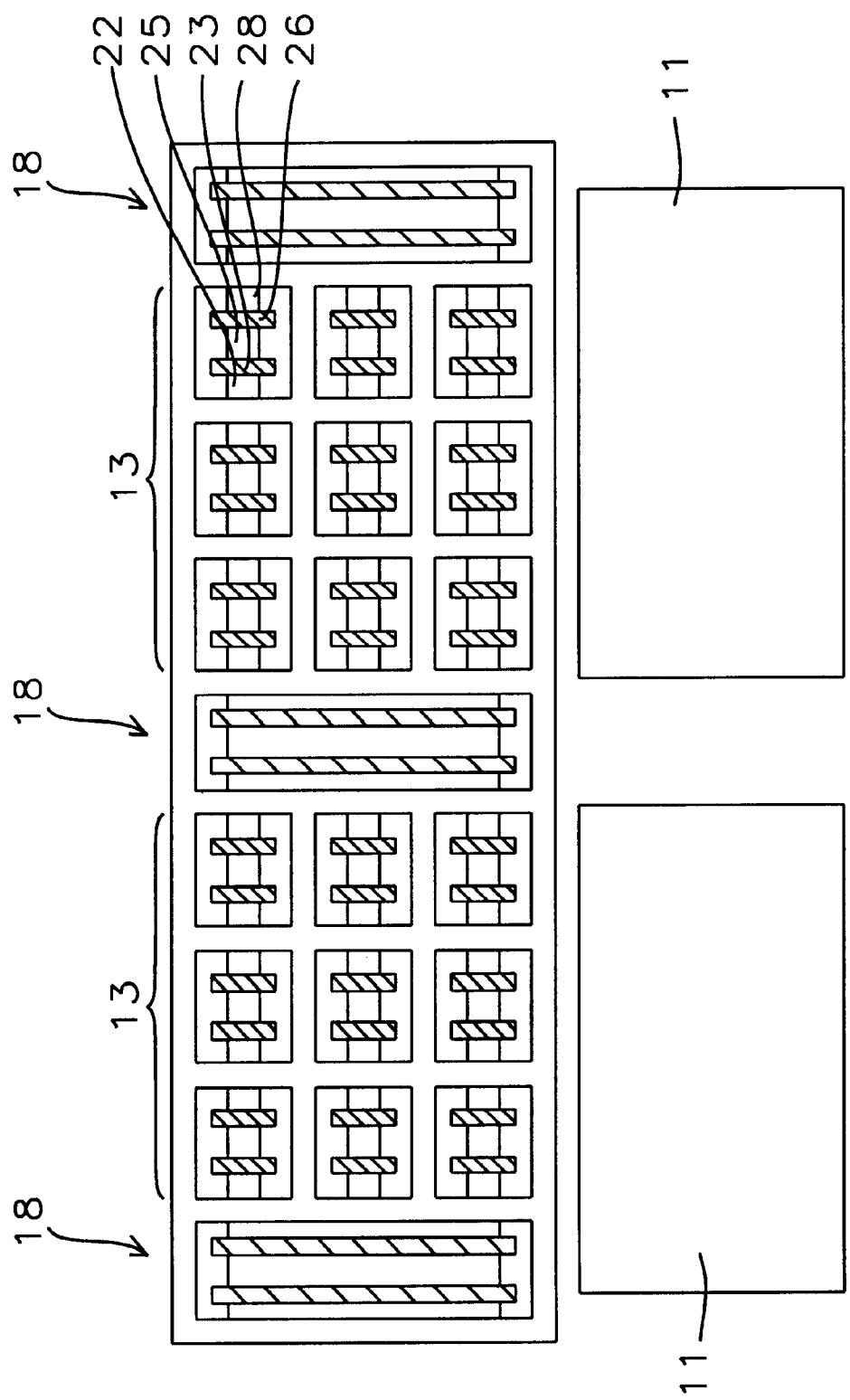

The Relation of FETs 13 and 18 to the Pad—FIGS. 7A Through 7C

FIG. 7A shows two adjacent pads with an open drain driver and a Vss to Vdd FET for each pad. The driver and Vss to Vdd FET on the left is the same as FIG. 6A and the driver and Vss to Vdd FET on the right is a mirror image. The connections are made in the way described for FIG. 6A.

FIG. 7B is similar to FIG. 7A except that the two pads share a common Vss to Vdd FET. If an ESD voltage appears between Vdd and either or both of the pads, the shared Vss to Vdd FET 18 breaks down and conducts the ESD current to Vdd. In normal operation the Vss to Vdd FET is turned off, and it does not interconnect the two pads and drivers or otherwise affect the operation of the chip.

FIG. 7C shows the shared driver of FIG. 7B and the mirror image Vss to Vdd FETs of FIG. 6B.

Figure 8:
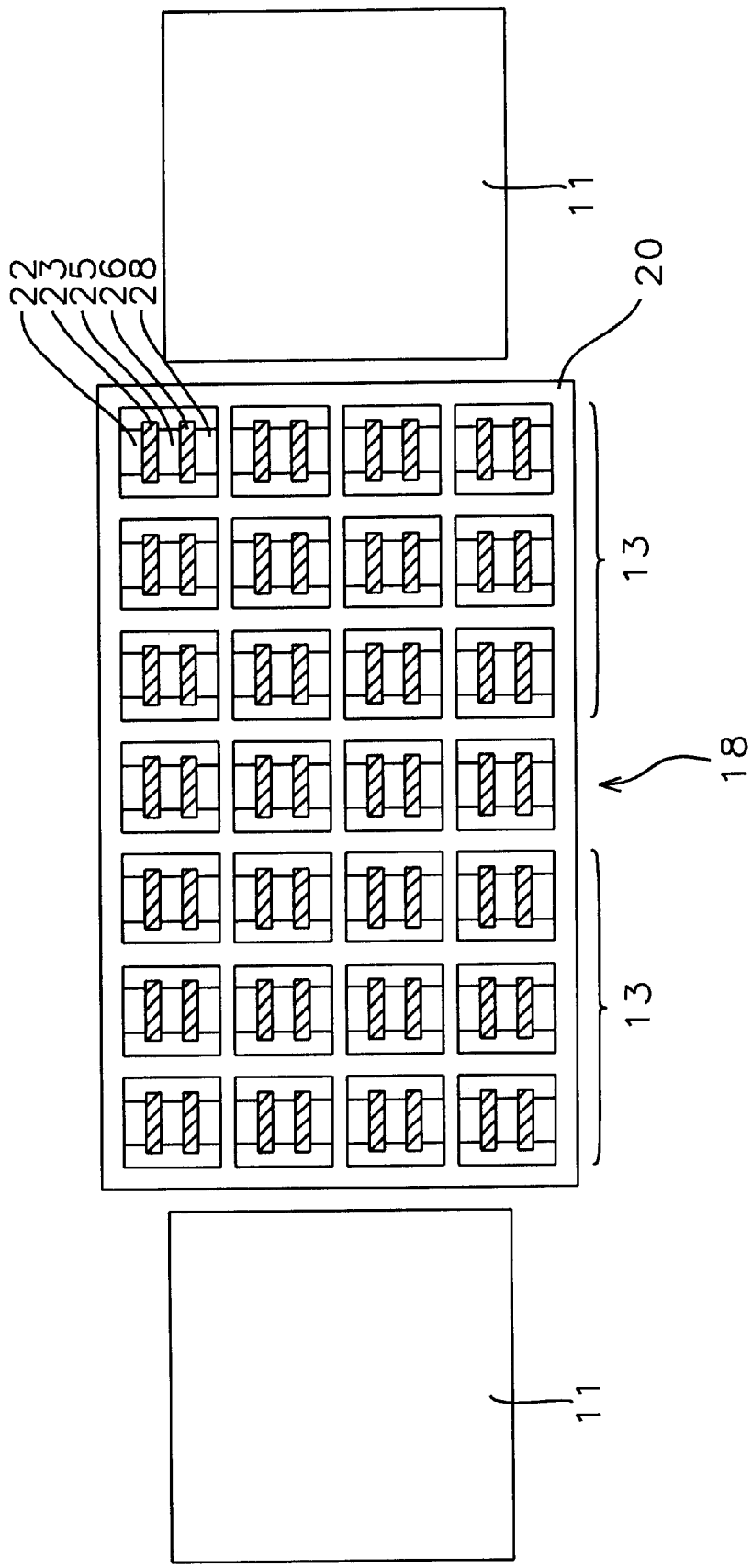
FIG. 8 shows another configuration of the open drain driver FET, the Vss to Vdd FET, and a pad protected by these FETs with a merged layout structure.

The Relation of FETs 13 and 18 to the Pad—FIG. 8

In FIG. 8, two pads are spaced apart by the structure of an open drain driver and a Vss to Vdd FET. Each driver is formed as an array of four rows and three columns of cells. The Vss to Vdd FET 18 is formed as a column of four cells and is shared in the way described for FIG. 7B. The cells of both FETs 13 and 18 are part of a common array and the cells of the driver and the Vss to Vdd FET differ only in their connections to the pad, Vss, Vdd, and the signal source. The connections to the pad, Vss, and Vdd are the same as described FIG. 6A.

OTHER EMBODIMENTS

A specific FET driver circuit has been described, but the art of open drain drivers is well developed and the invention will be useful with various open drain drivers, as will be readily understood without specific discussion. A specific Vss to Vdd FET has been described and those skilled in the art will recognize modifications of the preferred circuit within the skill of the art and the intended scope of the claims.

What is claimed is:

1. A circuit formed on a semiconductor chip, the chip having a plurality of pads where external signal connections can be made to the chip and the two power supply points, Vss and Vdd, wherein the improvement comprises:

a multi-cell open drain driver FET, wherein a cell comprises a source diffusion for a first FET, a source diffusion for a second FET, a drain diffusion common to the first and second FETs, a gate and an underlying channel for the first FET and a a gate and an underlying channel for the second FET, the two source diffusions being connected to Vss, the common drain diffusion being connected to an associated pad, and the two gates being connected to receive a signal for turning the driver on and off, each cell having a frame of the opposite conductivity type to the drain and source diffusions located around the first and second FETs, the frame being connected to Vss, the cells of the open drain driver being located closely adjacent to an associated pad, the open drain driver FET having the property of conducting between the pad and Vss when one of the junctions of the channel with the source and drain is reverse biased to break down by an ESD voltage between the pad and Vss, and a Vss to Vdd FET comprising at least one cell having the source and gates connected to Vss, the Vss to Vdd FET having the property of conducting between Vss and Vdd when the driver conducts between the pad and Vss in response to an ESD voltage between the pad and Vdd, the driver array and the Vss to Vdd FET being located closely adjacent and wherein the frame has segments shared by the driver array and the Vss to Vdd FET.

2. The circuit of claim 1 wherein the cells of the driver array are formed in an array of rows and columns.

3. The circuit of claim 2 wherein the frame has segments shared by adjacent cells.

4. The circuit of claim 3 wherein the Vss to Vdd FET comprises a plurality of cells and the cells of the Vss to Vdd FET and the cells of the driver are formed in a merged structure.

5. The circuit of claim 3 wherein the connections to the cell are made by conductors running along rows and columns of the array.

6. The circuit of claim 3 wherein the Vss to Vdd FET is formed as a multi-cell array.

7. The circuit of claim 3 wherein the driver is spaced from the associated pad in a predetermined direction and the multi-cell array of the Vss to Vdd FET is spaced from the driver array in an orthogonal direction.

8. The circuit of claim 7 wherein the Vss to Vdd FET comprises first and second arrays symmetrically with respect to the driver array.

9. The circuit of claim 7 wherein the multiple cells of the Vss to Vdd FET are aligned with the cells of the open drain driver.

10. The circuit of claim 8 wherein the driver array is closely adjacent to the associated pad and the Vss to Vdd FET array is spaced from the driver array in the same direction as the driver array.

11. The circuit of claim 6 wherein two adjacent pads each have a driver array of cells located in the space between the two pads and each have a Vss to Vdd FET located in the space between the two driver arrays.

12. The circuit of claim 6 wherein two adjacent pads each have a driver array of cells located in the space between the two pads and a single Vss to Vdd FET array is located in the space between the two driver arrays.

13. A semiconductor chip with improved ESD protection at a pad, the chip having two power supply points, Vss and Vdd, wherein the improvement comprises:

an open drain driver circuit and a Vss to Vdd FET formed on the chip and each having as a cell, a source diffusion for a first FET, a source diffusion for a second FET, a drain diffusion common to the first and second FETs, a gate and an underlying channel for the first FET and a gate and an underlying channel for the second FET, and a frame of the opposite conductivity type as the drain and source surrounding the first and second FETs, the driver having a plurality of cells arranged in a row and column array and closely located adjacent an associated pad, means connecting the sources of the driver cells to Vss, means connecting the drains of the driver cells to the pad, and means connecting the gates of the driver cells to receive a signal for turning the driver on and off, the Vss to Vdd FET having at least one cell, the Vss to Vdd FET being located near the driver and the associated pad and sharing at least one frame part with the driver, and means connecting the drain diffusion to Vdd.

14. The chip of claim 13 wherein the Vss to Vdd FET has a plurality of cells.

15. The chip of claim 14 wherein adjacent cells of the Vss to Vdd FET and the driver share a common frame part.

16. The chip of claim 15 wherein the Vss to Vdd FET has a plurality of cells on each side of the driver array and the cells are aligned with the cells of the driver array.

17. The chip of claim 15 wherein two adjacent pads each have a driver array of cells located in the space between the two pads and each have a Vss to Vdd FET located in the space between the two driver arrays.

18. The circuit of claim 15 wherein two adjacent pads each have a driver array of cells located in the space between the two pads and a single Vss to Vdd FET array is located in the space between the two driver arrays.

\* \* \* \* \*